(12) United States Patent
Yang et al.

(10) Patent No.: US 8,067,306 B2
(45) Date of Patent: Nov. 29, 2011

(54) INTEGRATED CIRCUIT PACKAGING SYSTEM WITH EXPOSED CONDUCTOR AND METHOD OF MANUFACTURE THEREOF

(75) Inventors: DeokKyung Yang, Hanam-si (KR); SeungYun Ahn, Ichon-si (KR)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/714,320

(22) Filed: Feb. 26, 2010

(65) Prior Publication Data
US 2011/0210437 A1    Sep. 1, 2011

(51) Int. Cl.
*H01L 21/44* (2006.01)
(52) U.S. Cl. ........ 438/612; 438/106; 438/107; 438/127; 257/E21.499; 257/E21.502; 257/E21.508
(58) Field of Classification Search ........... 257/E21.512, 257/E21.515
See application file for complete search history.

(56) References Cited

U.S. PATENT DOCUMENTS

| | | | |
|---|---|---|---|
| 5,924,623 A * | 7/1999 | Kenney | 228/180.22 |
| 6,238,952 B1 | 5/2001 | Lin | |
| 7,345,361 B2 | 3/2008 | Mallik et al. | |
| 7,642,133 B2 | 1/2010 | Wu et al. | |
| 7,653,991 B2 | 2/2010 | Mok et al. | |
| 7,714,453 B2 | 5/2010 | Khan et al. | |
| 2006/0040423 A1 * | 2/2006 | Savastibuk et al. | 438/106 |
| 2007/0190690 A1 | 8/2007 | Chow et al. | |
| 2007/0273049 A1 * | 11/2007 | Khan et al. | 257/787 |
| 2008/0073769 A1 | 3/2008 | Wu et al. | |
| 2008/0258289 A1 | 10/2008 | Pendse et al. | |
| 2009/0250810 A1 | 10/2009 | Pendse | |
| 2010/0000775 A1 | 1/2010 | Shen et al. | |

OTHER PUBLICATIONS

U.S. Appl. No. 12/714,291, filed Feb. 26, 2010, Shim et al.

\* cited by examiner

*Primary Examiner* — Cheung Lee
(74) *Attorney, Agent, or Firm* — Mikio Ishimaru

(57) ABSTRACT

A method of manufacture of an integrated circuit packaging system includes: providing a substrate; forming a component connector on the substrate; forming a resist layer on the substrate with the component connector exposed; forming a vertical insertion cavity in the resist layer, the vertical insertion cavity isolated from the component connector or a further vertical insertion cavity, the vertical insertion cavity having a cavity side that is orthogonal to the substrate; forming a rounded interconnect in the vertical insertion cavity, the rounded interconnect nonconformal to the vertical insertion cavity; and mounting an integrated circuit device on the component connector.

20 Claims, 4 Drawing Sheets

INTEGRATED CIRCUIT PACKAGING SYSTEM WITH EXPOSED CONDUCTOR AND METHOD OF MANUFACTURE THEREOF

CROSS-REFERENCE TO RELATED APPLICATION

The present application contains subject matter related to concurrently filed U.S. patent application Ser. No. 12/714,291. The related application is assigned to STATS ChipPAC Ltd.

TECHNICAL FIELD

The present invention relates generally to an integrated circuit packaging system, and more particularly to a package system with an exposed conductor.

BACKGROUND ART

Products must compete in world markets and attract many consumers or buyers in order to be successful. It is very important for products to continue to improve in features, performance, and reliability while reducing product costs, product size, and equally important to be available quickly for purchase by the consumers or buyers.

Market growth for high density and high output/input integrated circuit packages has resulted in a trend for electronic products that are lightweight, smaller in size, multi-functional, and with ever increasing higher speeds. Electronic products such as cell phone base products, global positioning systems (GPS), satellites, communication equipment, consumer products, and a vast line of other similar products are in ever increasing global demand.

Therefore, there is an important need for smaller packages. The smaller packages need to be electrically connected with other parts and components. As the smaller packages with more circuits continue to get shrink in size, there is a greater need to produce the smaller packages with more and more package connectors to support continually increasing amounts of electrical connections to and from those smaller packages.

Thus, an increasing need remains to increase the electrical connections of packages as the sizes of the packages continue to shrink in size while the circuits inside those packages continue to increase. It is also critical that the electrical connections are created and placed with precision so that each of the electrical connections is spaced apart from one another. The smaller packages and their electrical connections must be able to be connected to circuit boards and deliver increasing functionality, speed, and performance. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve reliability and product yields to meet competitive pressures adds an even greater urgency to the critical necessity for finding answers to these problems.

Solutions to these problems have been long sought after but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a substrate; forming a component connector on the substrate; forming a resist layer on the substrate with the component connector exposed; forming a vertical insertion cavity in the resist layer, the vertical insertion cavity isolated from the component connector or a further vertical insertion cavity, the vertical insertion cavity having a cavity side that is orthogonal to the substrate; forming a rounded interconnect in the vertical insertion cavity, the rounded interconnect nonconformal to the vertical insertion cavity; and mounting an integrated circuit device on the component connector.

The present invention provides an integrated circuit packaging system including: a substrate; a component connector on the substrate; a resist layer having a vertical insertion cavity on the substrate, the component connector exposed from the resist layer, the vertical insertion cavity isolated from the component connector or a further vertical insertion cavity, the vertical insertion cavity having a cavity side that is orthogonal to the substrate; a rounded interconnect in the vertical insertion cavity and nonconformal to the vertical insertion cavity; and an integrated circuit device on the component connector.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
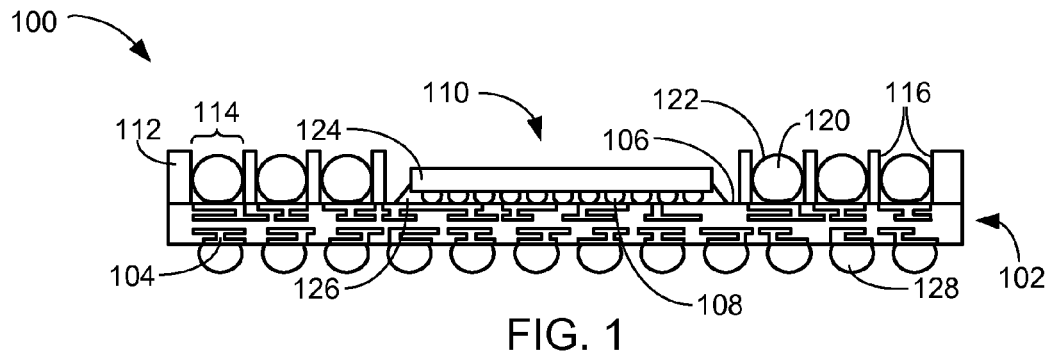
FIG. 1 is a cross-sectional view of an integrated circuit packaging system taken along a line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGS. Similarly, although the views in the drawings shown for ease of description and generally show similar orientations, this depiction in the FIGS. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction of an element perpendicular or orthogonal to yet another element. Terms, such as "below", "bottom", "top", "side" (as in "sidewall"), "higher", "lower", "upper", "over", and "under", are defined with respect to the horizontal plane.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Figure 2:
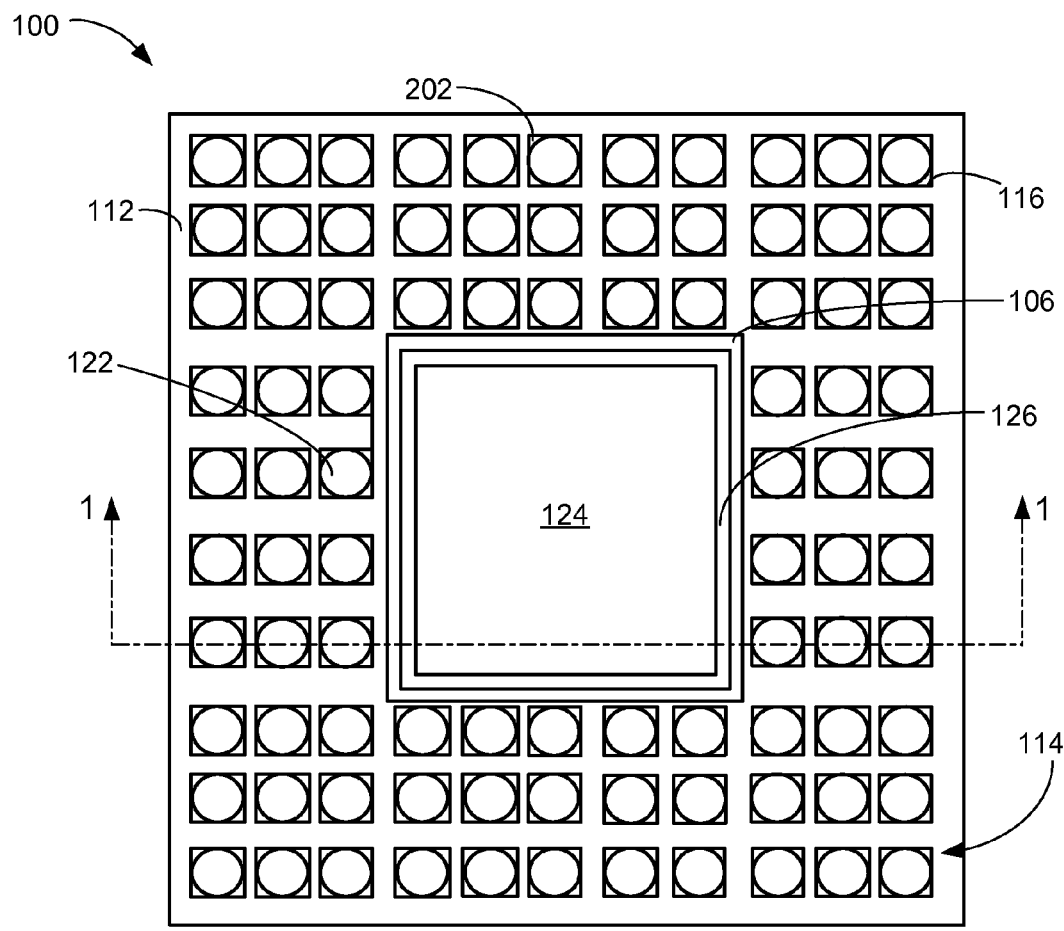
FIG. 2 is a top view of the integrated circuit packaging system of FIG. 1.

Referring now to FIG. 1, therein is shown a cross-sectional view of an integrated circuit packaging system 100 taken along a line 1-1 of FIG. 2 in a first embodiment of the present invention. The integrated circuit packaging system 100 can preferably include a substrate 102.

The substrate 102 can include base conductors 104 exposed on a component side 106 of the substrate 102 and a side of the substrate 102 opposite the component side 106. The base conductors 104 can be formed using materials that are electrically conductive and provide connectivity between sides of the substrate 102.

Component connectors 108 provide connectivity to the substrate 102 and can be formed using electrically conductive materials. The component connectors 108 can be mounted on the base conductors 104 exposed on the component side 106 and located within a component region 110 of the substrate 102. The component region 110 is defined as a region on the component side 106 of the substrate 102 for mounting and attaching other components onto the substrate 102, as will further be described below.

For illustrative purposes, the component region 110 is shown located on a center portion of the substrate 102. The component region 110 could be located at other positions on the component side 106. For example, the component region 110 can be located with an offset towards one side of the substrate 102 or along one side of the substrate 102.

A resist layer 112 can preferably cover portions of the component side 106 outside of the component region 110 and exposing the component connectors 108 on the substrate 102, The resist layer 112 is a permanent resin based coating formed on the component side 106 using curable materials that include photo sensitive, thermo sensitive, or chemical sensitive materials. The component side 106 within the component region 110 and the component region 110 are exposed from the resist layer 112.

An example of the resist layer 112 is a solder resist associated with a laminated substrate, which is an example of the substrate 102. The resist layer 112 can be used to protect the base conductors 104, to protect the component side 106, and to provide thermal and structural rigidity to the substrate 102.

Vertical insertion cavities 114 can be formed in the resist layer 112 to expose the base conductors 104 of the substrate 102 below the resist layer 112. Cavity sides 116 of the resist layer 112, forming the boundaries of the vertical insertion cavities 114, can be vertical with respect to the component side 106 of the substrate 102. The vertical insertion cavities 114 with the cavity sides 116 can be substantially orthogonal to the component side 106 of the substrate 102. and isolated from the component connectors (108) or from one another.

Rounded interconnects 120 can be formed and mounted on the base conductors 104 and located inside the vertical insertion cavities 114 of the resist layer 112. The rounded interconnects 120 are electrical interconnects formed from materials having restorative properties and substantial surface tension. The restorative properties and the surface tension provide mutual molecular cohesive forces that result in each of the rounded interconnects 120 having no more than two cohesive surfaces 122.

Any of the cohesive surfaces 122 is a surface having a single profile shape of either a circular, an elliptical, or a curved shape. The cohesive surfaces 122 of the rounded interconnects 120 do not conform to an interior shape of any of the vertical insertion cavities 114.

The result of the rounded interconnects 120 not conforming and nonconformal to the vertical insertion cavities 114 is a dampened transference of movement between the resist layer 112 and the rounded interconnects 120 from thermal variations. The dampened transference of movement results in a reduction of structural stress to the rounded interconnects 120 or the resist layer 112.

A portion of the cohesive surfaces 122 of the rounded interconnects 120 can be exposed from the resist layer 112 to provide electrical connectivity between an electronic component (not shown) and the integrated circuit packaging system 100. The rounded interconnects 120 can be applied, distributed, mounted, or attached on to the base conductors 104 before the restorative properties are restored.

An integrated circuit device 124 with an active side can be mounted on the component connectors 108 in the component region 110 adjacent the resist layer 112 and below an exposed side of the resist layer 112. The active side of the integrated circuit device 124 is mounted on the component connectors 108 to provide electrical connectivity between the integrated circuit device 124 and the substrate 102.

An underfill 126 can be applied around the component connectors 108 and between the integrated circuit device 124 and the substrate 102. The underfill 126 is a material used between the integrated circuit device 124 and the substrate 102 to protect the component connectors 108 and the integrated circuit device 124 from damage. The underfill 126 does not completely cover the integrated circuit device 124 and is constrained on the active side.

System connectors 128 that can include conductive balls, pins, or leads, can be mounted on the base conductors 104 exposed on the side of the substrate 102 opposite the component side 106. The system connectors can be used to provide connectivity between the integrated circuit packaging system 100 and another electronic component.

It has been discovered that the present invention provide the integrated circuit packaging system 100 with high connectivity structure. The rounded interconnects 120 in the vertical insertion cavities 114 of the resist layer 112 provide high density electrical connectivity resulting in the high connectivity structure. The rounded interconnects 120 in the vertical insertion cavities 114 also reduces the keep out zones due to the resist layer 112 acting as a barrier between the rounded interconnects 120 and the reduction of the keep out zones further increases the density of the rounded interconnects 120 that further contributes to the high connectivity structure.

It has also been discovered that the present invention provide the integrated circuit packaging system 100 with higher reliability and higher yield. The resist layer 112 with the vertical insertion cavities 114 prevents warpage and mechanical damage while improving surface mount technology yield. The reduction in warpage also improves reliability of the integrated circuit packaging system 100.

Referring now to FIG. 2, therein is shown a top view of the integrated circuit packaging system 100 of FIG. 1. Shown are the integrated circuit device 124, the underfill 126, the component side 106, the resist layer 112, and the cohesive surfaces 122. The underfill 126 is shown beyond sides of the integrated circuit device 124 located on the component side 106.

The resist layer 112 is shown formed around the underfill 126 and separated from the underfill 126 by the component side 106. The cohesive surfaces 122 are shown exposed within the vertical insertion cavities 114 of the resist layer 112.

Portions of the cohesive surfaces 122 of the rounded interconnects 120 can be formed opposite to and not in contact with the cavity sides 116 or areas of the component side 106 exposed within the vertical insertion cavities 114. Three-dimensional regions between the portions of the cohesive surfaces 122 opposite to and not in contact with the cavity sides 116 or the component side 106 can be defined as cavity gaps 202.

The cavity gaps 202 exposing the component side 106 of the substrate 102 are shown between the rounded interconnects 120 and the cavity sides 116. The cavity gaps 202 provide for the reduction or dampening of thermal or mechanical structural stress between the rounded interconnects 120 and the resist layer 112.

It has been discovered that the present invention of the integrated circuit packaging system 100 significantly improves convection thermal dissipation. The vertical insertion cavities 114 being vertical is important to the thermal dissipation from the substrate 102. The vertical profile of the cavity sides 116 allows the rounded interconnects 120 to adhere to the cavity sides 116 while the surface tension of the rounded interconnects 120 help form the rounded configuration of the rounded interconnects 120. This round configuration gives rise to the cavity gaps 202 between the rounded interconnects 120 and the cavity sides 116 as well as the substrate 102. As the integrated circuit device 124 generates heat, some of the heat is transferred to the substrate 102, primarily through conductive paths in the substrate 102. These conductive paths lead to the vertical insertion cavities 114. The cavity gaps 202 created by the vertical profile of the cavity sides 116 and the rounded interconnects 120 allows convection thermal dissipation from the substrate 102 through the vertical insertion cavities 114 thereby providing a thermal management solution. Without the vertical profile of the cavity sides 116 and the rounded interconnects 120 may not have the surface adhesion needed to form the cavity gaps 202 and without the cavity gaps 202, the convection thermal dissipation through the vertical insertion cavities 114 would not be possible.

It has also been discovered that the present invention of the integrated circuit packaging system 100 significantly improves mechanical mating and fit. The vertical profile of the cavity sides 116 of the vertical insertion cavities 114 allow mechanical press fit along at least two opposing of the cavity sides 116 hereby reinforcing the mechanical bond with the rounded interconnects 120 and any electrical connector (not shown) from a mounting device (not shown). As geometries get smaller and input/output density gets higher, the amount of surface area from the rounded interconnects 120 to form a solid and reliable intermetallic compound (IMC) (not shown) that is required for a solder joint, as an example, gets ever so smaller. The cavity sides 116 reinforces the mechanical bound of the IMC at the rounded interconnects 120 resulting in a more reliable interconnect with a mounting device while still allowing increases in input density, output density, and shrinking sizes of the rounded interconnects 120.

Figure 3:
FIG. 3 is the structure of FIG. 1 in a connector attachment phase of manufacture.

Referring now to FIG. 3, therein is shown the structure of FIG. 1 in a connector attachment phase of manufacture. The electrical connectors 302 can be formed and mounted on the base conductors 104 exposed on the component side 106 during the connector attachment phase. The connector attachment phase can include a printing and a reflow process of the component connectors over the substrate 102.

Figure 4:
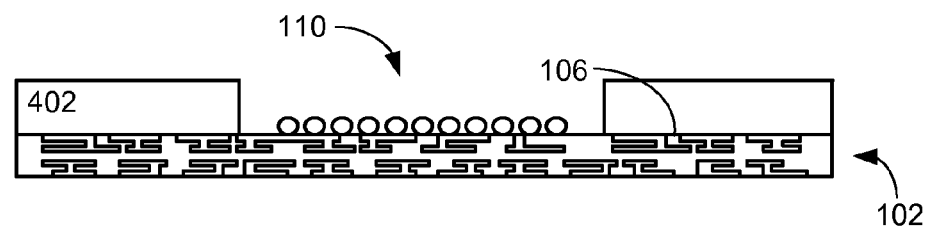
FIG. 4 is the structure of FIG. 3 in a substrate coating phase.

Referring now to FIG. 4, therein is shown the structure of FIG. 3 in a substrate coating phase. The mask layer 402 can cover portions of the component side 106 and not covering the component region 110 on the substrate 102 during the substrate coating phase. The substrate coating phase can include a photosensitive layer coating process.

Figure 5:
FIG. 5 is the structure of FIG. 4 in a coating removal phase.

Referring now to FIG. 5, therein is shown the structure of FIG. 4 in a coating removal phase. From the mask layer 402 of FIG. 4, the resist layer 112 can be formed having the cavity sides 116. The cavity sides 116 form the side boundaries of the vertical insertion cavities 114 to expose the base conductors 104 of the substrate 102 during the coating removal phase. The coating removal phase can include a positive resist or negative resist removal process.

It has been discovered that the resist layer 112 with the vertical insertion cavities 114 can be formed in a more flexible and faster process flow than a similar process flow using an epoxy molding compound. The resist layer 112 with the vertical insertion cavities 114 provides the benefits of both a solder mask for solder as well as provide benefits and functionality of an epoxy molding compound.

Figure 6:
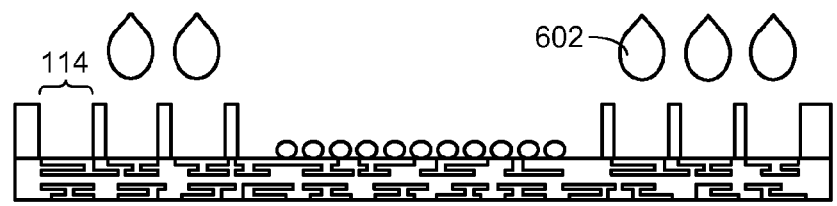
FIG. 6 is the structure of FIG. 5 in an assembly insertion phase.

Referring now to FIG. 6, therein is shown the structure of FIG. 5 in an assembly insertion phase. A conductive material 602 having restorative properties that provide substantial surface tension can be inserted in the vertical insertion cavities 114 during the interconnect insertion phase. The interconnect insertion phase can include a solder injection, a printing, or ball dropping process.

Figure 7:
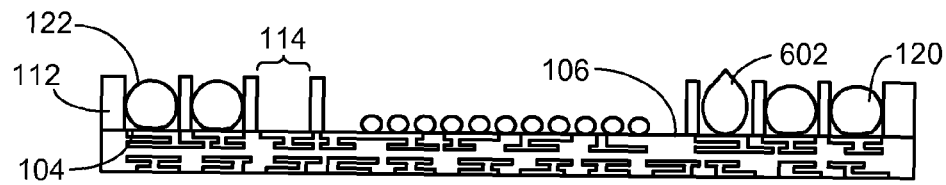
FIG. 7 is the structure of FIG. 6 in a reflow phase.

Referring now to FIG. 7, therein is shown the structure of FIG. 6 in a reflow phase. The rounded interconnects 120 with the cohesive surfaces 122 can be formed and connected on the base conductors 104 exposed on the component side 106 below the vertical insertion cavities 114 during the reflow phase.

The rounded interconnects 120 with the cohesive surfaces 122 can be formed from the conductive material 602, mounted, and connected on the base conductors 104 during the reflow phase. The reflow phase can include a controlled heating process using a reflow oven fixture, an infrared lamp, or a hot air emitter and result in electrical connectivity between the rounded interconnects 120 and the base conductors 104 exposed by the vertical insertion cavities 114.

Figure 8:
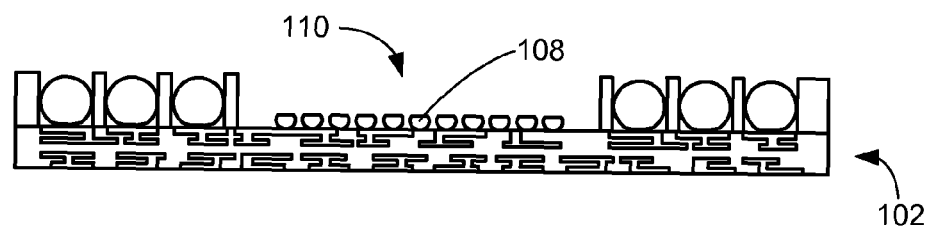
FIG. 8 is the structure of FIG. 7 in a coining phase.

Referring now to FIG. 8, therein is shown the structure of FIG. 7 in a coining phase. The electrical connectors 302 of FIG. 3 within the component region 110 of the substrate 102 can be coined or flattened during the coining phase to form the component connectors 108. The coining phase can include a stamping, a pressing, or a cold-working process.

Figure 9:
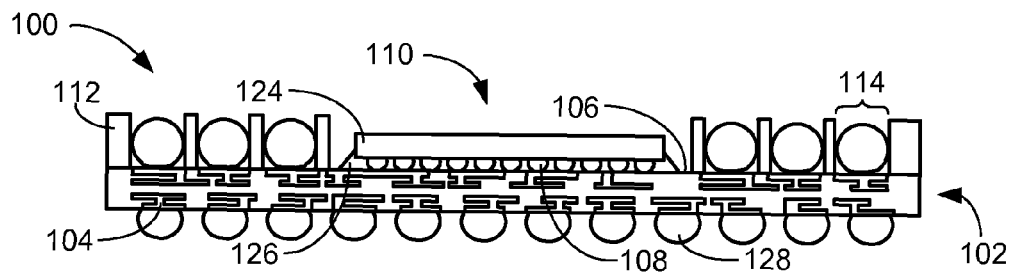
FIG. 9 is the structure of FIG. 8 in a material dispensing phase.

Referring now to FIG. 9, therein is shown the structure of FIG. 8 in a material dispensing phase. The integrated circuit device 124 is shown oriented over the component region 110 and mounted on the component connectors 108 attached on the component side 106. The system connectors 128 are shown connected to the base conductors 104 exposed on the side of the substrate 102 opposite the component side 106.

The component connectors 108 can be surrounded by the underfill 126 during the material dispensing phase. The material dispensing phase can include application of a conformal fill material using an injection, a dispensing, a heating process, or any combination thereof.

It has been discovered that the resist layer 112 can prevent the underfill 126 from bleeding into the vertical insertion cavities 114 of the resist layer 112 and contaminating the vertical insertion cavities 114. Preventing the contamination of the vertical insertion cavities 114 results in robust and reliable electrical connectivity between the rounded interconnects 120 and the substrate 102.

Figure 10:
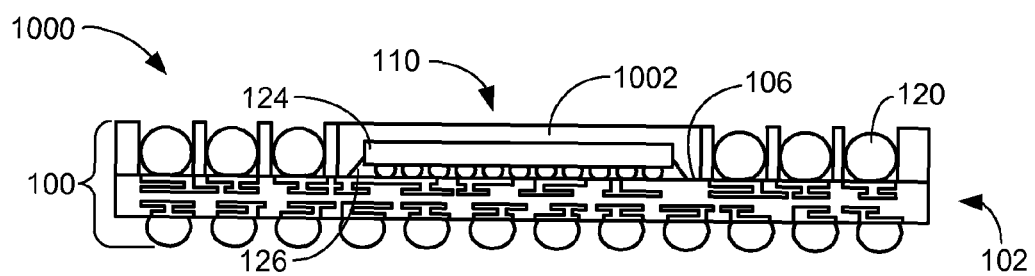
FIG. 10 is a cross-sectional view of an integrated circuit packaging system in a second embodiment of the present invention.

Referring now to FIG. 10, therein is shown a cross-sectional view of an integrated circuit packaging system 1000 in a second embodiment of the present invention. The integrated circuit packaging system 1000 can preferably include the integrated circuit packaging system 100.

An encapsulation 1002 can be used to encapsulate and cover the integrated circuit device 124, the underfill 126, and the component region 110 of the substrate 102. The encapsulation 1002 can conform to the component region 110 of the substrate 102, the integrated circuit device 124, the underfill 126, and the vertical sides of the resist layer 112 to provide additional protection from damage.

It has further been discovered that the encapsulation 1002 and the resist layer 112 with the vertical insertion cavities 114 prevents warpage and mechanical damage while improving surface mount technology yield.

It has been discovered that the present invention provides the integrated circuit packaging system 1000 with improved reliability. The encapsulation 1002 within the resist layer 112 prevents movement or bending of the substrate 102 directly below the component region 110 thereby mitigating or eliminating warpage that would result in degraded reliability.

Figure 11:
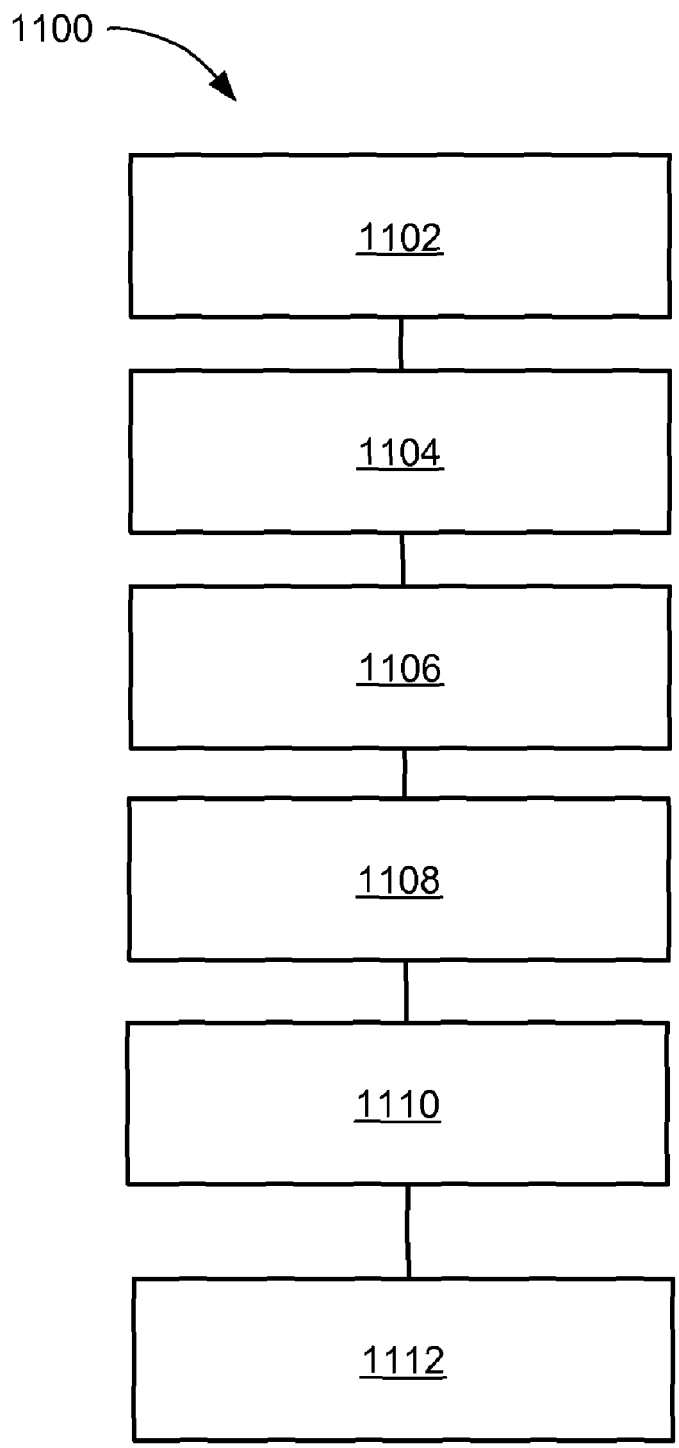
FIG. 11 is a flow chart of a method of manufacture of an integrated circuit packaging system in an embodiment of the present invention.

Referring now to FIG. 11, therein is shown a flow chart of a method 1100 of manufacture of an integrated circuit packaging system in an embodiment of the present invention. The method 1100 includes providing a substrate in a block 1102; forming a component connector on the substrate in a block 1104; forming a resist layer on the substrate with the component connector exposed in a block 1106; forming a vertical insertion cavity in the resist layer, the vertical insertion cavity isolated from the component connector or a further vertical insertion cavity, the vertical insertion cavity having a cavity side that is orthogonal to the substrate in a block 1108; forming a rounded interconnect in the vertical insertion cavity, the rounded interconnect nonconformal to the vertical insertion cavity in a block 1110 and mounting an integrated circuit device on the component connector in a block 1112.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package in package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a substrate;
   forming a component connector on the substrate;
   forming a resist layer on the substrate with the component connector exposed;
   forming a vertical insertion cavity in the resist layer, the vertical insertion cavity isolated from the component connector or a further vertical insertion cavity, the vertical insertion cavity having a cavity side that is orthogonal to the substrate;
   forming a rounded interconnect adhered to the cavity side in the vertical insertion cavity and providing a cavity gap exposing the substrate between portions of the rounded interconnect opposite to and not in contact with the cavity side and the cavity side; and
   mounting an integrated circuit device on the component connector.

2. The method as claimed in claim 1 wherein forming the rounded interconnect includes forming the rounded interconnect having a cohesive surface with a curved shape.

3. The method as claimed in claim 1 wherein mounting the integrated circuit device includes mounting the integrated circuit device adjacent the resist layer.

4. The method as claimed in claim 1 wherein forming the rounded interconnect includes forming a portion of the rounded interconnect opposite to and not in contact with the resist layer and the substrate.

5. The method as claimed in claim 1 further comprising applying an encapsulation over the integrated circuit device.

6. A method of manufacture of an integrated circuit packaging system comprising:
   providing a substrate;
   forming a component connector on the substrate;
   forming a resist layer on the substrate with the component connector exposed;
   forming a vertical insertion cavity in the resist layer, the vertical insertion cavity having sides orthogonal to the substrate and isolated from the component connector or a further vertical insertion cavity, the vertical insertion cavity having a cavity side that is orthogonal to the substrate;

forming a rounded interconnect adhered to the cavity side in the vertical insertion cavity and providing a cavity gap exposing the substrate between portions of the rounded interconnect opposite to and not in contact with the cavity side and the cavity side; and mounting an integrated circuit device on the component connector adjacent the vertical insertion cavity.

7. The method as claimed in claim 6 wherein forming the rounded interconnect includes forming the rounded interconnect having a cohesive surface with an elliptical shape.

8. The method as claimed in claim 6 wherein forming the vertical insertion cavity in the resist layer includes forming the vertical insertion cavity to expose the substrate.

9. The method as claimed in claim 6 wherein forming the rounded interconnect includes forming a portion of the rounded interconnect opposite to and not in contact with the vertical insertion cavity in the resist layer or the substrate.

10. The method as claimed in claim 6 further comprising applying an encapsulation over the integrated circuit device, the encapsulation conforming to the substrate.

11. An integrated circuit packaging system comprising:
a substrate;
a component connector on the substrate;
a resist layer having a vertical insertion cavity on the substrate, the component connector exposed from the resist layer, the vertical insertion cavity isolated from the component connector or a further vertical insertion cavity, the vertical insertion cavity having a cavity side that is orthogonal to the substrate;
a rounded interconnect adhered to the cavity side in the vertical insertion cavity and to provide a cavity gap between portions of the rounded interconnect opposite to and not in contact with the cavity side and the cavity side; and an integrated circuit device on the component connector.

12. The system as claimed in claim 11 wherein the rounded interconnect includes the rounded interconnect having a cohesive surface with a curved shape.

13. The system as claimed in claim 11 wherein the integrated circuit device includes the integrated circuit device mounted adjacent the resist layer.

14. The system as claimed in claim 11 wherein the rounded interconnect includes a portion of the rounded interconnect opposite to and not in contact with the resist layer and the substrate.

15. The system as claimed in claim 11 further comprising an encapsulation over the integrated circuit device.

16. The system as claimed in claim 11 wherein the integrated circuit device is adjacent to the vertical insertion cavity.

17. The system as claimed in claim 16 wherein the rounded interconnect includes the rounded interconnect having a cohesive surface with an elliptical shape.

18. The system as claimed in claim 16 further comprising an underfill between the integrated circuit device and the substrate.

19. The system as claimed in claim 16 wherein the rounded interconnect includes a portion of the rounded interconnect opposite to and not in contact with the vertical insertion cavity in the resist layer or the substrate.

20. The system as claimed in claim 16 further comprising an encapsulation over the integrated circuit device, the encapsulation conformal to the substrate.

* * * * *